United States Patent [19]

Schlig

[11] 4,039,856
[45] Aug. 2, 1977

[54] DISTRIBUTED JOSEPHSON JUNCTION LOGIC CIRCUIT

[75] Inventor: Eugene Stewart Schlig, Somers, N.Y.

[73] Assignee: International Business Machines Corporation, Armonk, N.Y.

[21] Appl. No.: 636,868

[22] Filed: Dec. 2, 1975

[51] Int. Cl.² .......................................... H03K 19/195
[52] U.S. Cl. .................................... 307/212; 307/277; 307/306; 340/166 SC; 340/173.1; 357/5
[58] Field of Search ............... 307/212, 245, 277, 306; 357/5; 340/166 SC, 173.1, 347 M

[56] References Cited
U.S. PATENT DOCUMENTS

| | | | |
|---|---|---|---|
| 3,458,735 | 7/1969 | Fiske | 307/212 |
| 3,953,749 | 4/1976 | Baechtold et al. | 307/212 |

Primary Examiner—John Zazworsky
Assistant Examiner—Marcus S. Rasco
Attorney, Agent, or Firm—Thomas J. Kilgannon, Jr.

[57] ABSTRACT

A distributed Josephson junction logic circuit is disclosed which includes a plurality of serially disposed Josephson junctions in a superconductive wire-over-groundplane environment wherein the latter is terminated at both ends in its characteristic impedance and energized at one end with a constant voltage source. In addition, at least one portion of the wire-over-groundplane transmission line, which is disposed in series with the junctions, is utilized as an output control and has the same steady state current flowing in it as the plurality of Josephson junctions. Utilizing such an arrangement, logic can be performed by means of multiple controls on a single junction as in terminated line logic or by means of several junctions, each with one or more independent controls, in series. The design is such that the switching of any one or more junctions to the voltage state causes a decrease in current from a level which represents a logical "1" to a lesser current which is representative of a logical "0". The resulting logic circuits may be latching or non-latching in character. When both ends of the distributed Josephson junction logic circuit are terminated in the characteristic impedance of the associated transmission line, inputs and outputs can be located at arbitrary points along the transmission line. The terminating resistors, returned at both ends of the line to points of low impedance to ground compared to the impedance of the terminating resistor, absorb transients originating on the power line or at any point along the transmission line. When any one or more of the inputs to such a circuit is a logical "1", at least one of the associated gates switches to the voltage state, reducing the output current to the logical "0" level. In a latching mode of operation, the circuit latches in that state until the gate current is momentarily quenched by reducing the power supply voltage. Thus, each stage normally inverts. The logic operation performed is a positive NOR, which is sufficient to implement any logical function. If desired, two or three controls can be used with some or all of the gates to perform such functions as inhibit, AND-OR-INVERT and majority and threshold logic. Logic circuits utilizing Josephson junctions operating at the gap which provide constant voltages are shown. In addition, circuit arrangements incorporating series-parallel powering circuits and the interconnection of logic circuits between more than one circuit arrangement are shown.

34 Claims, 5 Drawing Figures

DISTRIBUTED JOSEPHSON JUNCTION LOGIC CIRCUIT

BACKGROUND OF THE INVENTION

1. Field of the Invention

This invention relates generally to Josephson junction circuits and is more specifically related to Josephson junction logic circuits. Still more specifically, it relates to logic circuits with spatially distributed inputs and outputs. The outputs, which are formed by portions of a wire-over-groundplane transmission line, are disposed in series with a plurality of Josephson junctions, each of which may have one or more input control lines. The circuit which is terminated at both ends with a resistor equal to the characteristic impedance of the transmission line is powered from a constant voltage power supply. Neither the fan-in nor the fan-out is limited by d.c. design considerations and, in common with other terminated line Josephson circuits, switching speeds in the tens of picoseconds are obtainable. As a result of this unique combination of features, the above described circuit is potentially applicable to picosecond array logic, read-only stores, decoder-driver arrays, memory sense lines, data busses and carry look-ahead networks, as well as to random logic networks.

2. Description of the Prior Art

Josephson junction devices and Josephson junction logic circuits are well known in the prior art. The basic theoretical explanation of the Josephson effect is given in an article "Possible New Effect in Superconductive Tunneling" by B. Josephson, published in *Physics Letters*, July 1962, pp. 251–253. Since then, numerous other prior art references disclosing Josephson devices and showing their applications have been published. For example, J. Matisoo in an article entitled "The Tunneling Cryotron — A Superconductive Logic Element Based on Electron Tunneling" in *Proceedings of the IEEE*, Vol. 55, pp. 172–180, February 1967, discusses early work which uses Josephson tunneling devices in the logic environment. More recently, D. J. Herrell, in an article entitled "Femtojoule Josephson Logic Gates", published in the *IEEE Journal of Solid State Circuits*, Vol. SC-9, pp. 277–282, October 1974, shows a demonstrated applicability to very fast logic operating at cryogenic temperatures.

A terminated line logic circuit (TLL) is shown in U.S. Pat. No. 3,758,795 in the name of Anacker et al, issued Sept. 11, 1973, and assigned to the same assignee as the present invention. In this patent, a single Josephson junction fed from a current source is shunted by a transmission line which is terminated at its center by a series resistor of resistance twice the characteristic impedance of the transmission line. This circuit has a fan-in of only two or three and practically unlimited fan-out capabilities. It is properly terminated only for differential mode signals originating at the gate. As a consequence, only signals which are exactly equal and opposite in polarity at the terminating resistor are properly terminated. Thus, the delay must be equal on the two lines which extend between the logic gate and the terminating resistor. As a consequence, only one gate is used in each logic stage. Logic is generally performed by three controls placed side by side over the gate and fan-in is limited to two (for inverters) or three control lines localized to the gate. The two lines needed to carry signals from the gate to the most remote output impose a burden on wireability which is substantially eased by the present circuit.

U.S. Pat. No. 3,458,735, entitled "Superconductive Totalizer or Analog to Digital Converter" which issued on July 29, 1969 to M. D. Fiske shows a plurality of Josephson junction devices arranged in series which are fed from a constant current source. Since Fiske is detecting the sum of the voltage drops across the series string of Josephson junctions, it is clear that he does not utilize a constant voltage source similar to that called for by the present application.

An IBM Technical Disclosure Bulletin entitled "Josephson Junction Circuit" by G. J. Lasher, Vol. 11, No. 10, March 1969, p. 1222, shows a Josephson junction in the transmission line environment which is terminated with the characteristic impedance of the strip line so that no reflected signal returns to the junction due to its own a.c. emission. This publication is concerned with improving the bistable behavior of a Josephson junction and is not concerned with a Josephson device having a control line; the voltage states of which are communicated to output portions which, in turn, are coupled to other Josephson junctions.

Similarly, IBM Technical Disclosure Bulletin, Vol. 15, No. 3, August 1972, p. 899, in an article entitled "Josephson Junction Circuits Having Magnetic Feedback" by H. H. Zappe shows in FIG. 2 a single Josephson device controlled by a plurality of associated control lines. This publication, like the Lasher publication, shows only one device and, while there is a suggestion in Fiske that devices may be placed in series, there is no suggestion or indication that such serially arranged devices can be substituted for the single device of Lasher to achieve a logic circuit wherein a plurality of Josephson junctions can be disposed in a substantially random fashion and appear as a properly terminated logic circuit for wave fronts originating from the switching of any of the serially disposed Josephson junctions. The distributed Josephson junction logic circuit of the present application is believed to be distinguishable and unobvious over all the above cited prior art in that it unexpectedly provides a logic circuit which has superior fan-in capabilities relative to known circuits and practically unlimited fan-out capabilities when a transmission line containing serially disposed Josephson junctions and serially disposed control line portions is terminated at both ends in the characteristic impedance of the transmission line and energized at one end thereof by a constant voltage source. The particular arrangement of devices, matching terminating impedances and a constant voltage source provides a flexibility heretofore not obtainable using prior art arrangements.

SUMMARY OF THE INVENTION

In accordance with the broadest aspect of the present invention, a Josephson junction logic circuit is provided which includes a superconductive or very highly conductive line disposed in insulated spaced relationship with a superconductive or very highly conductive groundplane. It further includes a plurality of Josephson junctions disposed along said conductive line and a pair of resistive terminations disposed at each end of the conductive line which are equal to the characteristic impedance thereof and at least a single control line coupled to each of said junctions. A constant voltage source connected in series with said conductive line is provided.

In accordance with the broader aspects of the present invention, at least another Josephson junction is disposed in electromagnetically coupled relationship with at least a portion of said conductive line.

In accordance with more specific aspects of the present invention, means responsive to the switching of at least one of the plurality of Josephon junctions is disposed in series with said Josephson junctions.

In accordance with still more specific aspects of the present invention, a means for sensing is connected to the Josephson junction which is disposed in electromagnetically coupled relationship with at least a portion of the conductive line.

In accordance with still more specific aspects of the present invention, bias means coupled to said plurality of Josephson junctions is also provided.

In accordance with still more specific aspects of the present invention, means for applying a voltage is provided which includes a voltage divider connected to the conductive line wherein the voltage divider has an effective resistance equal to the resistance of the terminations.

In accordance with still more specific aspects of the present invention, a plurality of Josephson tunneling circuit arrangements are provided, each of which contain a plurality of logic circuits connected between a plurality of power busses. Here, the voltage source utilized consists of a series string of Josephson devices operating at their gap voltage, each one of which provides a voltage to a plurality of logic circuits which are connected in parallel across it.

In accordance with still more specific aspects of the present invention, interconnection means are provided between circuit arrangements which permit a logic circuit to be connected between one power bus on one circuit arrangement and another power bus on another circuit arrangement, where the potential difference between the power busses is the potential difference required to operate the logic circuits.

It is, therefore, an object of the present invention to provide a Josephson junction logic circuit with spatially distributed inputs and outputs.

Another object is to provide a Josephson junction logic circuit wherein neither the fan-in nor the fan-out is limited by d.c. design considerations.

Another object is to provide a DJTL logic circuit wherein the input currents to a DJTL circuit are outputs from a preceding DJTL circuit and the outputs of the DJTL circuit are inputs to a succeeding DJTL circuit.

Still another object is to provide a Josephson junction logic circuit which is properly terminated for any wavefront regardless of its origin in the circuit.

Still another object is to provide a Josephson logic circuit which can be employed in systems either as a random logic gate, or can be organized into functional arrays.

The foregoing and other objects, features and advantages of the invention will become apparent from the following more particular description of the preferred embodiment of the invention as illustrated in the accompanying drawings.

DETAILED DESCRIPTION OF PREFERRED EMBODIMENTS

Figure 1:
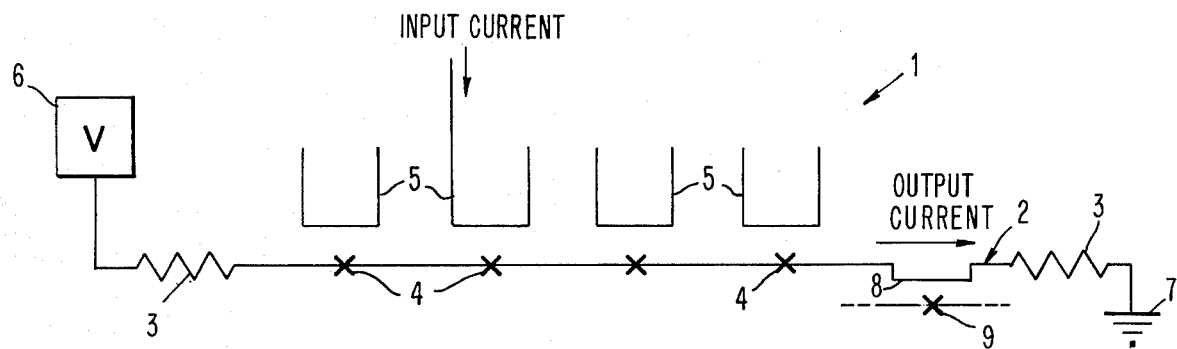
FIG. 1 is a schematic drawing of a distributed Josephson junction logic circuit in accordance with the teaching of the present invention.

Referring now to FIG. 1 there is shown a schematic drawing of a distributed Josephson tunneling logic (DJTL) circuit 1 in its simplest one control per gate form. DJTL circuit 1 includes a superconductive transmission line 2 which is terminated at both ends thereof by resistors 3 of value R which is equal to the characteristic impedance of transmission line 2 which typically takes the form of a wire-overgroundplane or strip transmission line. A plurality of Josephson gates 4 are shown in series spaced relationship along transmission line 2. Each of gates 4 has a control line 5 disposed in electromagnetically coupled relationship with it. A constant voltage source or constant voltage clock pulse source 6 is shown disposed at one end of transmission line 2 and a reference potential 7 shown as ground in FIG. 1 is connected to the other end thereof. Transmission line 2 has an output control line portion 8 which is disposed in electromagnetically coupled relationship with an additional Josephson gate 9. Josephson gate 9 may be one of an additional plurality of Josephson gates similar to Josephson gates 4 only one of which is controlled by the current which flows in output control line portion 8. Alternatively, Josephson gate 9 could be a stand-alone gate which switches in response to the current levels in output control line portion 8, the switching or nonswitching of which represents the condition of one of Josephson gates 4. Josephson gates 4, 9 are well known to those skilled in the cryogenic arts and, in one embodiment, may consist of a pair of superconducting films spaced apart by a tunneling oxide. When current is applied to such devices below a threshold, Josephson tunneling current flows in what has been characterized as the zero voltage state. When the current through the device exceeds the threshold, either by increasing the current or by applying a current through an associated control line which has the effect of reducing the threshold, the device switches to what has been characterized as the voltage state. In the voltage state, the voltage drop is typically 2.5 mV, gate currents are typically on the order of a milliampere and control currents are also typically on the order of a milliampere.

Figure 2:
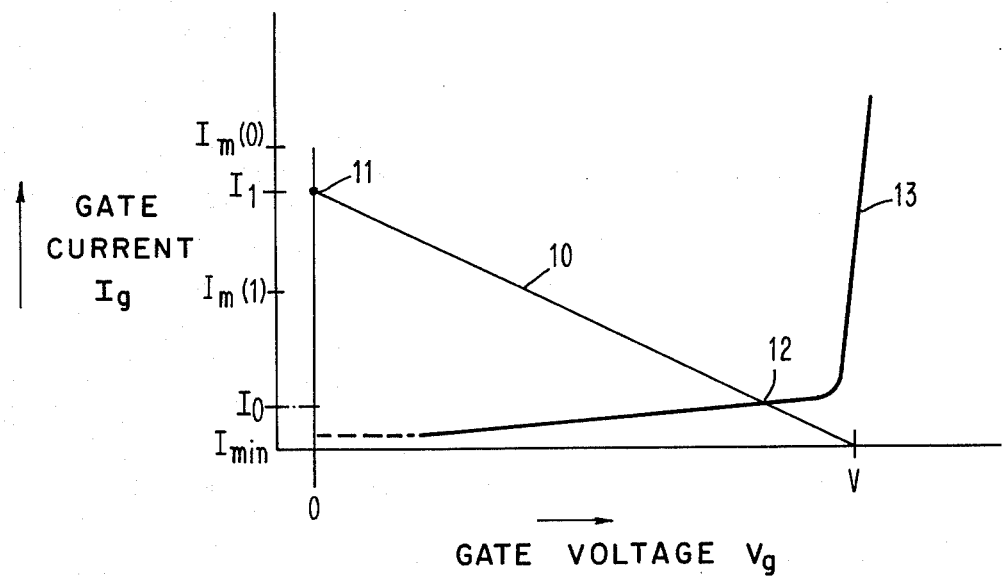
FIG. 2 shows a simplified current-voltage characteristic of a Josephson junction gate which includes a circuit load line.

Referring now to FIG. 2 there is shown therein a simplified current-voltage characteristic of a Josephson junction gate which may be utilized in the practice of the present invention and which includes a circuit load line. In the DJTL circuit of FIG. 1, all of the Josephson gates 4 are identical and, accordingly, the current-voltage characteristic shown in FIG. 2 represents the I-V characteristic of each of gates 4. In FIG. 1, the presence of control current of sufficient magnitude to constitute a logic "1" input on a control line 5 causes its associated gate 4 to switch to the voltage state, reducing the current in DJTL circuit 1 and thereby reducing the output current in control line portion 8 to a level which is representative of a logical "0" output. Where the current flow in all of control lines 5 is small in magnitude, corresponding to logical "0" inputs, none of the Josephson gates 4 switch and the output current, which is representative of a logical 1, flows in control line portion 8. The voltage and impedance levels are chosen so that the output is a logical 1 when all of gates 4 are in the zero voltage state (all inputs are a logical 0). When any one or more of the inputs is a logical 1, at least one of the corresponding gates switches to the voltage state, reducing the output current to the logical 0 level. These features are shown in FIG. 2 where load line 10 is shown intersecting the I-V characteristic of a representative Josephson gate 4 at points 11 and 12. Point 11 in FIG. 2 is the current which flows through a Josephson gate 4 with low (logical 0) current flowing in all of control lines 5. With proper choices of V and R, circuit 1 exhibits two stable states represented by points 11, 12 in FIG. 2. Assuming that a value of supply voltage, V, is applied to the circuit when the maximum Josephson current, $I_m$, of gates 4 has the value $I_m(o)$ corresponding to logical 0 input control currents, gates 4 of circuit 1 are in the two-particle (superconductive) state, the voltage across gates 4 is zero, and the current flowing in control line portion 8 is equal to $I_1$. The latter is further identified in FIG. 2 as point 11. The value of $I_1$ is equal to the voltage V divided by 2R. If the current applied to any of the control lines 5 is increased to correspond to a logical 1 input, so that the maximum Josephson current $I_m$ is effectively reduced to a value $I_m(1)$ which is less than $I_1$, Josephson junction 4 switches to the single-particle (voltage) state and the voltage drop across junction 4 reduces the output current to a smaller value, $I_0$, which is otherwise shown in FIG. 2 as point 12. While not specifically shown in FIG. 2, it should be appreciated that, upon applying control current to any one of control lines 5, the associated device switches from point 11 to point 12 following some dynamic trajectory of instantaneous voltage and current. That trajectory may transiently follow that portion of the I-V characteristic in FIG. 2 identified by reference numeral 13 as the current is reduced toward point 12. If, as shown in FIG. 2, the current flowing when device 4 is in the voltage state is greater than the minimum current, $I_{min}$, Josephson junction 4 latches in the voltage or resistive state and must be reset to the superconductive state by momentarily interrupting the power supply. If, however, $I_0$ is less than $I_{min}$, junction 4 can return to the superconductive state when the control line current to the associated Josephson device 4 is removed. This mode of operation is described as "non-latching" or "self-resetting". Both the latching and non-latching modes of operation will be discussed hereinbelow. From the foregoing, it should be clear that in terms of the operation of a Josephson device, no departure is made from what has been taught in the prior art. As shown in FIG. 1, the novelty of the present invention resides in the use of a plurality of known Josephson devices arranged in series in a transmission line wherein the latter is terminated at both ends in the characteristic impedance of the associated transmission line. Based on this mode of terminating, Josephson devices and transmission line output portions can be located at arbitrary points along the transmission line. While it is preferred that devices and output portions not be intermingled, it should be appreciated that output portions and input Josephson devices can be intermingled in any desired manner. Where inputs and outputs are intermingled, output signals tend to settle down more slowly than where the inputs and outputs are grouped. In addition, DJTL circuits similar to that shown in FIG. 1, which are terminated at both ends of the line, do not require that the power distribution line be brought close to the logic junctions. As a result, the power line can be located at the periphery of the logic network, an advantage which immediately improves the density of any logic network.

Josephson junctions operating at the gap voltage, typically 2.5 mV, are very effective local voltage regulating devices. It is therefore highly desirable that the voltage supply V have a magnitude which is a multiple of the gap voltage. It will be explained with reference to FIG. 4 that it is possible to use a power supply voltage which is a multiple of the gap voltage, yet have the DJTL circuit operate at a lower effective power supply voltage if desired.

In the case of latching operation, it has been pointed out that it is necessary to reset the Josephson devices of the logic circuits by momentarily interrupting the power supply. When several stages of latching logic circuits are interconnected so that the outputs of one stage become inputs to subsequent stages, it is necessary to insure either that the power supply to a given stage is not turned on or that the switching of its Josephson junctions is inhibited until all of its inputs from previous stages have their final, valid states. One way to accomplish this is by sequencing the turning on of the power supplies to each level of logic stages so that the power to each stage is applied only when its inputs are valid. Another way, when an additional enabling control is provided to each Josephson device in the logic circuit, is to enable the levels of logic stages sequentially. In logic networks many levels deep, three-phase power supply clocking, well known in the art, can be employed. In DJTL, with appropriate care either in timing or in circuit design, it is sufficient to supply the same clock pulse phase to pairs of successive levels of logic.

Figure 3:
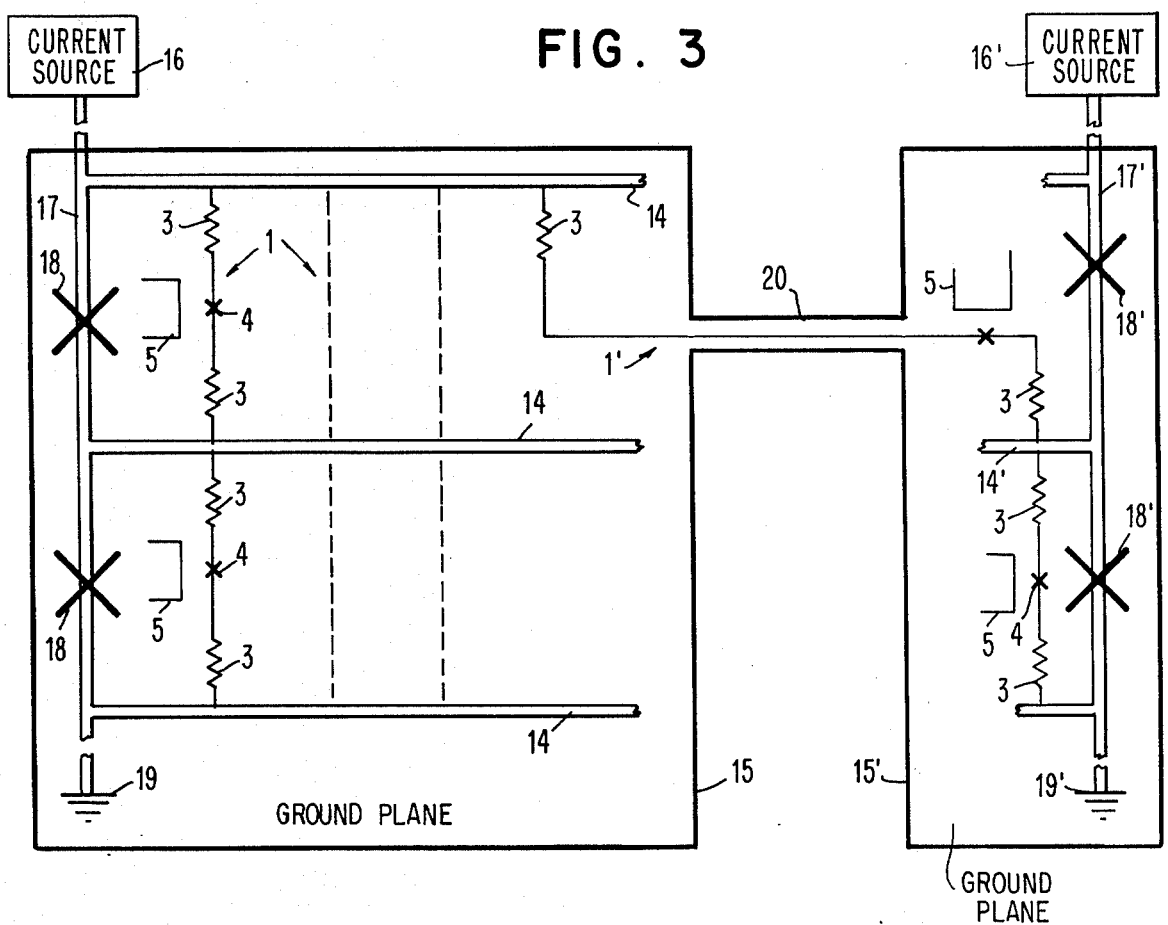
FIG. 3 is a schematic diagram of a series parallel constant voltage distribution scheme which can be utilized to power logic circuits similar to that shown in FIG. 1. In the present figure, no local d.c. ground return connections are used so the groundplanes of all the circuits can be electrically common. Distributed Josephson junction logic circuits can be connected between one power distribution and a proper second voltage level on another distribution system if proper ground return paths are provided.

Referring now to FIG. 3, there is shown therein a schematic diagram of a series-parallel constant voltage distribution scheme which can be utilized to power DJTL circuits similar to that shown in FIG. 1. In FIG. 3, DJTL circuits 1 are shown connected in parallel between low-impedance power busses 14 and both circuits 1 and power busses 14 are disposed over a conductive groundplane 15, otherwise shown in FIG. 3 as a dashed box. Busses 14 are connected to a current source 16 which feeds current via a distribution line 17 to a pair of serially disposed Josephson junctions 18 which are operating at the gap voltage of 2.5 millivolts which is the same voltage as voltage V shown in FIG. 2. Distribution line 17 is ultimately connected to groundplane 15 via ground connection 19, ensuring the achievement of a low impedance transmission line arrangement. At this point, it should be clear that a large number of busses 14 can be connected in parallel with distribution line 17 using a Josephson junction 18 between pairs of busses 14 as a fixed potential power source. In FIG. 3, a voltage drop of 5 millivolts is provided by Josephson junctions 18 between the uppermost and lowermost of power busses 14. The intermediate power bus 14 is at a potential of 2.5 millivolts relative to ground connection 19, while uppermost power bus 14 is at a potential of 5 millivolts relative to ground connection 19. From the foregoing, it should be apparent that the power connections to DJTL circuits 1 can be made to any two potentials differing by the required supply voltage and can be located between any two points on the voltage distribution lines. This can be seen in FIG. 3 where DJTL circuit 1' is shown connected between uppermost power bus 14 and another power bus 14' which is at the same potential as intermediate bus 14 by virtue of the presence of a pair of Josephson junctions 18' operating at the gap voltage in the same way as Josephson junctions 18. Ground plane 15' in FIG. 3 is at the same potential as groundplane 15. Josephson gate 4 of DJTL circuit 1' is shown in FIG. 3 disposed on groundplane 15' along with one of its terminating resistors 3 while the other of its terminating resistors 3 is shown disposed adjacent groundplane 15 and connected to the uppermost of power busses 14. To the extent that the termination 3 and gate 4 of DJTL circuit 1' can be on different groundplanes, this presents no problems since gate 4 of DJTL circuit 1' is still properly terminated for any wavefront regardless of its source. While only one gate 4 has been shown associated with each of DJTL circuits 1 and 1' in FIG. 3, it should be appreciated that a plurality of gates 4, output control line portions 8 and additional Josephson gates 9 can be utilized in the same manner in FIG. 3 as shown in FIG. 1. In FIG. 3, groundplanes 15,15' are shown interconnected by a narrow groundplane portion 20 to indicate that they are at substantially the same potential, and that DJTL circuit 1' passes from 15 to 15' by means of a superconductive transmission line of the same characteristic impedance as the segments of circuit 1' disposed over 15 and 15'. This showing in FIG. 3 is not intended to be a limitation inasmuch as logic circuits 1 over groundplanes 15 and 15' may be interconnected by any interconnection schemes well known to those skilled in the transmission line art. For example, using appropriate transitions and interconnections, two-wire transmission lines of the proper impedance can be utilized to carry power and signals between groundplanes 15,15'. Also, while a separate current source 16' is shown in FIG. 3 feeding transmission line 17', it should be appreciated that both transmission lines 17 and 17' are fed from the same current source 16. The ability to interconnect DJTL circuits 1 between any pair of power busses 14 as long as the potential difference between busses 14 is appropriate, adds a significant capability to logic circuits inasmuch as there need be no concern for the proper termination of such circuits regardless of where Josephson gates or control lines 5 are positioned. In contrast, signals on terminated line logic circuits must begin and end at a logic gate so that, in effect, two lines carry each logical signal compared to one for DJTL circuits 1. This advantage together with the greater logic power and topological freedom, results in greater circuit density and smaller propagation delay in DJTL circuits.

The constant voltage, series-parallel powering system shown in FIG. 3 presents no problem in terms of total current requirements which are similar to the requirements for constant current power systems. In addition, however, constant voltage power supply systems have the advantage that Josephson junctions, 18 and 18', operating at the gap are very effective constant voltage regulating devices because of their very low dynamic resistance. Where logic circuits are to be designed with the narrowest line width and highest propagation velocity permitted by the available technology, it is much more feasible to provide lower impedance constant-voltage power lines, which must be wider than the logic lines, than to provide higher impedance, constant-current power lines which must be narrower. In the latter instance, logic lines would have to be widened to the detriment of circuit density. Also, in both constant-current and constant-voltage powering systems, the logic circuit lines are in parallel with the power lines. This shunt loading of the power line helps regulation in the constant-voltage instance but does little for transient regulation in the constant-current case. Finally, in switching power on and off for clocking or resetting of logic circuits, the constant-voltage line is loaded by the logic circuits, each of which presents a resistive impedance which is high compared to the impedance ($Z_o$) of the associated power line. In the constant-current case, the logic circuit loads are predominantly capacitive because they are isolated from ground and are of low impedance compared to the impedance ($Z_o$) of the power line. Therefore, transients settle down faster in constant-voltage systems after the power is switched. Also, logic circuits loading the constant-voltage power line contribute to the damping of transients while the logic circuits which load a constant-current line are not terminated for common mode disturbances and thus tend to ring in response to power line pulses. As a result, it is feasible to sequence the switching of successive levels of DJTL circuits by means of multi-phase clocking of the power supply instead of by the use of multiple-control gates. From all the foregoing, it should be clear that FIG. 3 represents an integrated circuit arrangement which can be fabricated using well known techniques. Such circuit arrangements coupled with known memory arrays and the like can be interconnected to operate as a data processing unit in a cryogenic environment at extremely high speeds.

Figure 4:
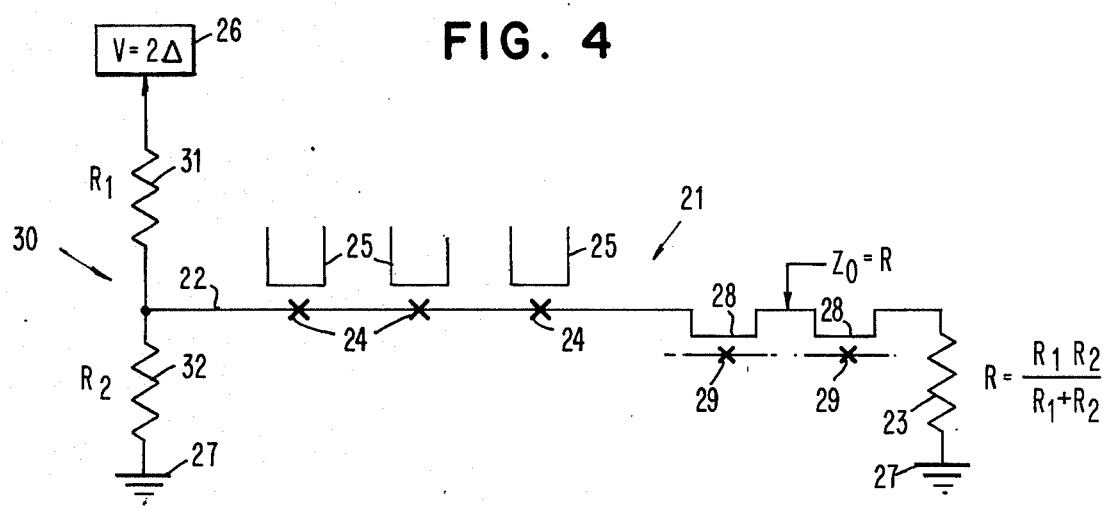
FIG. 4 is a schematic drawing of a Distributed Josephson Tunneling Logic circuit which operates at voltages lower than the power supply voltage by the use of a voltage divider. The arrangement permits the retention of a fixed voltage power supply while simultaneously reducing the voltage and terminating the circuit properly.

Referring now to FIG. 4 there is shown therein a schematic drawing of a DJTL circuit which operates at voltages lower than the supply voltage, V, by the use of a voltage divider. The circuit permits the retention of a fixed voltage power supply while simultaneously reducing the effective circuit voltage and terminating the circuit properly. One application for such a circuit which permits operation at voltages lower than the power supply voltage is where non-latching Josephson junction gates are used instead of the well-known latching type Josephson junctions. In general terms, non-latching Josephson gates must operate at comparatively low voltages in order to use values of Josephson current density ($J_1$) no higher than 10,000 amps/cm² and to avoid the use of inductive circuit elements. At the same time, it is desirable to use a power supply voltage equal to the gap voltage, $V = 2\Delta$, in order to take advantage of the voltage regulating ability of Josephson junctions. Operation at voltages lower than the gap may be accomplished in the DJTL regime by means of a resistive voltage divider shown in FIG. 4. The DJTL circuit 21 of FIG. 4 includes a superconductive transmission line 22, a terminating resistor 23, a plurality of non-latching Josephson gates 24 with their associated control lines 25, a constant voltage source 26, a reference potential 27, output control line portions 28 and additional Josephson gates 29. In addition, transmission line 22 is terminated at the input end thereof by voltage divider 30 consisting of resistors 31,32 and otherwise identified in FIG. 4 as resistors R1, R2, respectively. Resistor 23 which terminates transmission line 22 at the output end thereof, is otherwise identified in FIG. 4 as resistor R and is equal in value to the parallel combination of resistors R1 and R2 shown in FIG. 4 as R1 R2/(R1 + R2). Since the characteristic impedance, $Z_o$, of transmission line 22 is equal to R, transmission line 22 is terminated in its characteristic impedance at both ends thereof.

The circuit shown in FIG. 4 has been found to be capable of a worse case design with ± 10% tolerances on the maximum Josephson current, $I_{mo}$, ± 1% on the ratio of voltage divider 30, ±5% on the junction regulated supply voltage 26, and ± 10% on resistors R, R1, R2. The gate current, $I_{mo}$, tolerance is tighter in this design for non-latching devices primarily because the current in the superconductive state was designated to be a smaller fraction of the maximum Josephson current than is normally used in latching designs. This helps to minimize the required Josephson current density, $J_1$. With a 1 ohm characteristic impedance for transmission line 22, $I_{mo}$ is about 0.87 milliamps and the power dissipation is about 1.5 microwatts. This corresponds to a rather small junction size, about 55 microinches for a current density, $J_1$, equal to $10^4$ amps/cm$^2$. The values for resistors R1,R2 are 3.23 ohms, 1.45 ohms, respectively.

Figure 5:
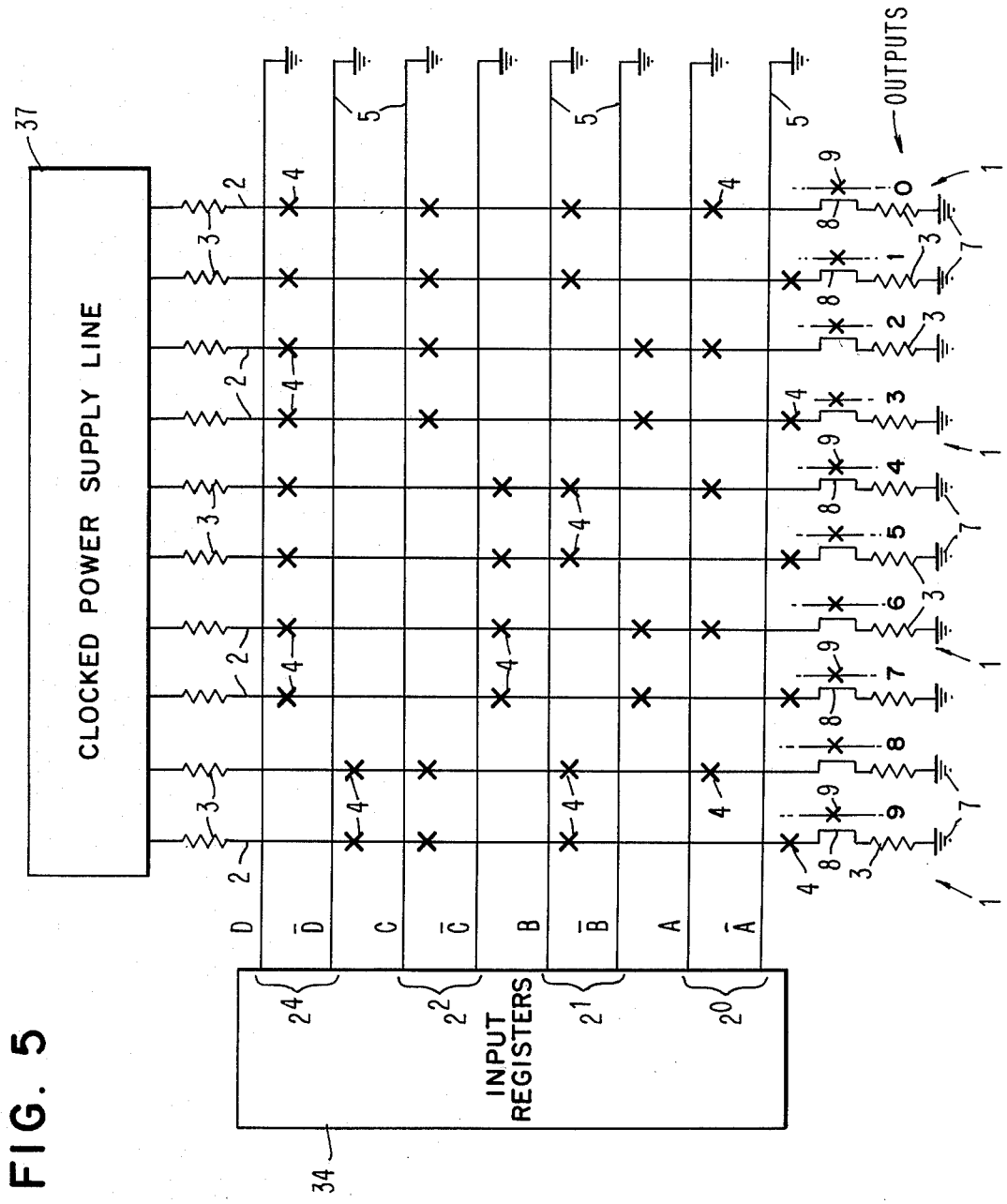
FIG. 5 is a schematic drawing of a binary to decimal decoder which exemplifies the use of the circuits of FIG. 1 in array form.

Referring now to FIG. 5, there is shown therein a schematic drawing of a binary-to-decimal decoder which exemplifies the use of DJTL circuits in array form. Since a plurality of circuits similar to that shown in FIG. 1 is utilized in FIG. 5, the same reference characters as used in FIG. 1 will be utilized to indicate the same elements in FIG. 5. A plurality of DJTL circuits 1 are shown connected to a clocked power supply line 33 in FIG. 5. Each circuit 1 contains a plurality of serially disposed Josephson gates 4, terminating resistors 3 and output control line portions 8. Control line portions 8 are connected to additional Josephson gates 9 which sense a decrease in the output current when any one of gates 4 in its associated DJTL circuit switches to the voltage state in response to a signal on a control line associated with each of gates 4. In FIG. 5, Josephson gates 4 are controlled by complementary inputs from input registers 34 in a predesigned manner which insures that one and only one output is provided in response to a given binary input. Thus, for example, signals from input registers 34 representative of the numeral 3 may be applied to control lines 5 to actuate a number of Josephson gates 4 which have been arranged in a predetermined fashion along superconductive transmission lines 2 of DJTL circuits 1 to provide for the switching of at least one gate 4 in each of the circuits 1 except for the one corresponding to the numeral 3. Thus, logical "1" level output current flows only in output control 8 of that circuit, and only the sense gate 9 corresponding to the numeral 3 is switched. The outputs from input registers 34 are double rail in character and the output terminals thereof are identified from top to bottom in FIG. 5 by the letters A-B and A-D. Thus, if the number 3 is represented in binary form, the outputs of input registers 34 on terminals A-D would be 1,1,0,0 and the outputs on terminals A-D would be their complement 0,0,1,1. With these signals applied to control lines 5 which are connected to the terminals of the registers 34, when clocked power supply line 38 is actuated, the following occurs: one of the gates 4, associated with control line 5 which has an output from terminal D, switch, since no (or low) current flows in the associated control line 5. However, since control line 5 associated with terminal D has current flowing in it due to the presence of a binary 1, its associated devices 4 switch to the voltage state, providing a decrease in current in portions 8 associated with outputs 8,9. With a binary 0 at terminal C, none of the gates 4, associated with control line 5 coupled to terminal C, switch. However, each of the gates 4 associated with the control line 5 coupled to terminal C which has a binary 1 present switches to the voltage state, causing a decrease in current in portions of associated with outputs 4,5,6,7. In a similar way, a binary 1 represented by current flow on control line 5 associated with terminal B causes switching of its associated Josephson gates 4. As a result, portion 8 associated with outputs 0 and 1 (in addition to outputs 4,5 and 8,9) have their current reduced. At the same time, the complementary binary 0 appearing on terminal B provides no (or low) current in the associated control line 5 and its associated gates 4 remain unswitched. Finally, a binary 1 on terminal A provides current on its associated control line 5 and all the associated Josephson gates 4 are switched to the voltage state. Thus, the current is reduced in portion 8 associated with output 2 in addition to portion 8 associated with outputs at 0, 4, 6 and 8 which have already been enabled as a result of the presence of other binary signals. This leaves output 3 alone with all of its associated gates 4 in the zero voltage state. Consequently only sense gate 9 associated with output 3 has a high current in its associated control 8. When sense current is applied to all of the sense gates 9, only sense gate 9 corresponding to numeral 3 switches to the voltage state. Since DJTL logic circuits are suitable for use as register latches, input registers 34 of FIG. 5 may be DJTL circuits and control lines 5 may be the output control portions 8 of the DJTL circuit. In that case, terminating resistors 3 would be provided in series with control lines 5 at the point at which they connect to ground. Furthermore, output controls 8 of the DJTL circuits of the array of FIG. 5 may be inputs to another array. More particularly, they may be, for example, the word lines of a Josephson memory array.

Until this point, nothing has been said concerning the fabrication of the DJTL circuits described hereinabove. Since they form no part of the present invention, no specific fabrication steps need be defined. It suffices to say that the circuits described hereinabove can be fabricated by well known deposition and photolithographic and etching techniques utilizing appropriate superconducting materials such as niobium, lead and appropriate oxides such as niobium oxide and lead oxide. Processes described in U.S. Pat. No. 3,849,276 filed Mar. 19, 1971, Ser. No. 125,993, entitled "Process for Forming Reactive Layers Whose Thickness is Independent of Time" by J. Greiner; U.S. Pat. No. 3,852,795 filed Jan. 3, 1973, Ser. No. 320,784, entitled "Josephson Tunneling Circuits with Superconducting Contacts" by I. Ames; and U.S. Pat. No. 3,849,136 filed July 31, 1973, Ser. No. 384,349, entitled "Masking of Deposited Thin Films by Use of a Masking Layer Photoresist Composite", by K. R. Grebe, all assigned to the same assignee as the present invention, may be utilized as described therein to fabricate the circuits of the present application.

As shown hereinabove, the distributed Josephson tunneling logic circuit can be employed in systems as random logic gates or organized into functional arrays such as array logic blocks, read-only stores and decoder-driver arrays. It may be used as a memory sense line with the state of a memory cell controlling each gate. It is also applicable to functions which, by their very nature, require large, spatially distributed fan-in such as data busses and carry look-ahead adders.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A Josephson tunneling logic circuit comprising:
   a conductive line disposed in insulating spaced relationship with a groundplane of given characteristic impedance,
   a plurality of devices capable of carrying Josephson current disposed along said line,
   a resistive termination disposed at each end of said conductive line, the resistance of said terminations being sufficient to permit a change in current flow when at least one of said devices switches,
   at least a single control line electrically coupled to each of said devices for switching said devices,
   means for applying a constant voltage connected to said conductive line, and,
   at least another device capable of carrying Josephson current and at least one portion of said conductive line disposed in electromagnetically coupled relationship with said at least another device.

2. A circuit according to claim 1 wherein said conductive line and said groundplane are superconductors.

3. A circuit according to claim 1 wherein said resistive terminations have a value of resistance equal to the characteristic impedance of said conductive line.

4. A circuit according to claim 1 wherein said resistive terminations have a value of resistance sufficient to permit said devices to operate in a latching mode.

5. A circuit according to claim 1 wherein said resistive terminations have a value of resistance sufficient to permit said devices to operate in a non-latching mode.

6. A circuit according to claim 1 wherein said at least a single control line includes a portion of a conductive line of at least another logic circuit similar to said logic circuit disposed in electromagnetically coupled relationship with said plurality of devices.

7. A circuit according to claim 1 wherein said means for applying a constant voltage is at least a single Josephson device operating at its gap voltage.

8. A circuit according to claim 1 wherein at least one of said resistive terminations is a voltage divider connected to said conductive line and a voltage source, said voltage divider having an effective resistance equal to the resistance of said termination.

9. A circuit according to claim 1 wherein said means for applying a constant voltage is a pulsed source of constant voltage.

10. A circuit according to claim 1 wherein said means for applying a constant voltage includes a constant voltage source of one potential connected to one resistive termination and a constant voltage source of another potential connected to the other of said resistive terminations.

11. A circuit according to claim 1 wherein said at least another device forms a portion of another logic circuit.

12. A Josephson tunneling logic circuit comprising:
    a conductive line disposed in insulating spaced relationship with a groundplane of given characteristic impedance,
    a plurality of Josephson devices capable of carrying Josephson current disposed along said line,
    a resistive termination disposed at each end of said conductive line, the resistance of said terminations being sufficient to permit a change in current flow when at least one of said devices switches,
    means for applying a constant voltage connected to said conductive line,
    means for applying inputs to said devices for switching said devices, and,
    output means including at least a portion of said conductive line and at least another device capable of carrying Josephson current disposed in electromagnetically coupled relationship with said at least a portion of said conductive line.

13. A circuit according to claim 12 wherein said means for applying inputs includes at least a single control line electromagnetically coupled to said devices.

14. A Josephson junction logic circuit according to claim 12 wherein said conductive line and said groundplane are superconductors.

15. A Josephson junction logic circuit according to claim 12 wherein said resistive terminations have a value of resistance equal to the characteristic impedance of said conductive line.

16. A Josephson junction logic circuit according to claim 12 wherein said resistive terminations have a value of resistance sufficient to permit said devices to operate in a latching mode.

17. A Josephson junction logic circuit according to claim 12 wherein said resistive terminations have a value of resistance sufficient to permit said devices to operate in a non-latching mode.

18. A circuit according to claim 12 wherein said means for applying a constant voltage is at least a single Josephson device operating at its gap voltage.

19. A circuit according to claim 12 wherein said at least another device forms a portion of another logic circuit.

20. A circuit according to claim 12 wherein at least one of said resistive terminations is a voltage divider connected to said conductive line and a constant voltage source, said voltage divider having an effective resistance equal to the resistance of said termination.

21. A circuit according to claim 12 wherein said means for applying a constant voltage is a pulsed source of constant voltage.

22. A circuit according to claim 13 wherein said at least a single control line includes a portion of a conductive line of at least another logic circuit similar to said logic circuit disposed in electromagnetically coupled relationship with said plurality of Josephson devices.

23. A Josephson tunneling circuit arrangement comprising:
    a distribution conductor disposed in insulated spaced relationship with a groundplane of given characteristic impedance, a plurality of power busses disposed in insulated spaced relationship with said groundplane connected to said distribution conductor, means connected to said power busses for applying a constant potential difference between each of said power busses, a plurality of Josephson tunneling logic circuits connected between power busses, having said constant potential difference, said logic circuits comprising a conductive line disposed in insulating spaced relationship with said groundplane of higher characteristic impedance than said given characteristic impedance, a plurality of devices capable of carrying Josephson currents disposed along said line, a resistive termination disposed at each end of said conductive line, the resistance of said termination being sufficient to permit a change in current flow when at least one of said devices switches, means for applying inputs to said devices for switching said devices.

24. A circuit according to claim 23 further including output means electrically connected to said conductive line.

25. A circuit according to claim 23 wherein said means for applying inputs includes at least a single control line electromagnetically coupled to each of said devices.

26. A circuit arrangement according to claim 23 wherein said resistive terminations have a value of resistance equal to said higher characteristic impedance.

27. A circuit arrangement according to claim 23 wherein said resistive terminations have a value of resistance sufficient to permit said devices to operate in a latching mode.

28. A circuit arrangement according to claim 23 wherein said resistive terminations have a value of resistance sufficient to permit said devices to operate in a nonlatching mode.

29. A circuit according to claim 24 wherein said output means includes at least a portion of said conductive line and at least another device capable of carrying Josephson current disposed in electromagnetically coupled relationship with said at least a portion of said conductive line.

30. A circuit arrangement according to claim 24 wherein said means for applying a constant potential difference between each of said power busses includes a current source and a plurality of Josephson devices disposed in series along said distribution conductor each of said devices being in parallel with two power busses to apply a constant potential difference between said power busses.

31. A circuit arrangement according to claim 25 wherein said at least a single control line includes a portion of a conductive line of another logic circuit disposed in electromagnetically coupled relationship with said plurality of devices similar to said logic circuit.

32. A circuit arrangement according to claim 29 wherein said at least another device forms a portion of another logic circuit.

33. A circuit arrangement according to claim 30 further including at least another circuit arrangement similar to said circuit arrangement said logic circuits of said another circuit arrangement being connected between power busses to apply a given constant potential difference thereto and means for interconnecting at least one logic circuit to a power bus of said circuit arrangement and to a power bus of said at least another circuit arrangement, the potential difference between said power busses being equal to said given potential difference.

34. A circuit arrangement according to claim 33 wherein said means for interconnecting includes a transmission line of the same characteristic impedance as that of said logic circuits of said circuit arrangement and said at least another circuit arrangement.

* * * * *